(12) United States Patent
Hess et al.

(10) Patent No.: US 8,588,724 B2
(45) Date of Patent: Nov. 19, 2013

(54) OPTIMAL NARROWBAND INTERFERENCE REMOVAL FOR SIGNALS SEPARATED IN TIME

(75) Inventors: Phillip B. Hess, Los Angeles, CA (US); Patrick Nercessian, Burbank, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 0 days.

(21) Appl. No.: 12/859,730

(22) Filed: Aug. 19, 2010

(65) Prior Publication Data

US 2011/0053546 A1    Mar. 3, 2011

Related U.S. Application Data

(60) Provisional application No. 61/235,620, filed on Aug. 20, 2009.

(51) Int. Cl.
*H04B 1/10* (2006.01)

(52) U.S. Cl.
USPC ........ 455/312; 455/307; 455/501; 455/67.13; 375/351

(58) Field of Classification Search
USPC .............. 455/296–312, 63.1–65, 67.13, 570, 455/501–506; 375/316–352
See application file for complete search history.

(56) References Cited

U.S. PATENT DOCUMENTS

| | | | |
|---|---|---|---|
| 5,741,591 A | 4/1998 | Tashiro et al. | |
| 5,742,591 A | 4/1998 | Himayat | |
| 5,901,180 A * | 5/1999 | Aslanis et al. | 375/261 |
| 6,164,284 A | 12/2000 | Schulman et al. | |
| 6,185,452 B1 | 2/2001 | Schulman et al. | |
| 6,208,894 B1 | 3/2001 | Schulman et al. | |
| 6,315,721 B2 | 11/2001 | Schulman et al. | |
| 6,426,983 B1 | 7/2002 | Rakib | |
| 6,564,807 B1 | 5/2003 | Schulman et al. | |
| 6,648,813 B2 | 11/2003 | Zilberman et al. | |
| 6,765,531 B2 * | 7/2004 | Anderson | 342/378 |
| 6,804,561 B2 | 10/2004 | Stover | |
| 6,829,508 B2 | 12/2004 | Schulman et al. | |
| 7,237,712 B2 * | 7/2007 | DeRocco et al. | 235/375 |

(Continued)

FOREIGN PATENT DOCUMENTS

WO    2005107088 A1    11/2005

OTHER PUBLICATIONS

Han M, Yu T, Kim J, Kwak K, Lee S, Han S, Hong D, "OFDM Channel Estimation With Jammed Pilot Detector Under Narrow Band Jamming", IEEE Transactions on Vehicular Technology, vol. 57, No. 3, May 2008, pp. 1934-1939.

(Continued)

*Primary Examiner* — Edward Urban
*Assistant Examiner* — Rui Hu
(74) *Attorney, Agent, or Firm* — Malcolm J. Romano; Peter Holmes

(57) ABSTRACT

A system and method for improving the processing of communications signals received in the presence of narrowband interference signals. The received communications signals are time sampled and transformed into a series of spectral terms in the frequency domain that are then evaluated to identify narrowband interference signals. The identified narrowband interference terms can be calculated to a value that will optimize the corrupted spectral terms resulting from the communication, and an inverse transformation can be used to generate a time domain signal that is free from interference.

10 Claims, 5 Drawing Sheets

(56) References Cited

U.S. PATENT DOCUMENTS

| | | | |
|---|---|---|---|
| 7,280,467 B2* | 10/2007 | Smee et al. | 370/208 |
| 7,558,337 B2* | 7/2009 | Ma et al. | 375/316 |
| 7,881,412 B2* | 2/2011 | Banister | 375/346 |
| 2002/0094044 A1* | 7/2002 | Kolze et al. | 375/346 |
| 2007/0036239 A1* | 2/2007 | Ma et al. | 375/316 |
| 2007/0202829 A1* | 8/2007 | Roovers et al. | 455/296 |
| 2008/0112309 A1* | 5/2008 | Hamaguchi et al. | 370/208 |
| 2008/0118012 A1* | 5/2008 | Corke et al. | 375/348 |
| 2008/0130714 A1* | 6/2008 | Wilborn et al. | 375/144 |
| 2008/0143580 A1* | 6/2008 | Glazko et al. | 342/17 |
| 2008/0212666 A1* | 9/2008 | Kuchi et al. | 375/231 |
| 2009/0060016 A1* | 3/2009 | Liu | 375/229 |
| 2010/0159858 A1* | 6/2010 | Dent et al. | 455/131 |
| 2013/0114659 A1* | 5/2013 | Murakami et al. | 375/224 |

OTHER PUBLICATIONS

Milstein LB, "Interference Rejection Techniques in Spread Spectrum Communications", Proceedings of the IEEE, vol. 76, No. 6, Jun. 1988, pp. 657-671.

Laster, JD, "Burst GMSK Demodulation Using Demodulator Diversity and BER Estimation", Ph. D. Thesis, Virginia Polytechnic Institute and State University, Mar. 1997, Chapter 3, pp. 29-70, Internet address: http://scholar.lib.vt.edu/theses/public/etd-5941513972900/etd.pdf, Accessed Dec. 27, 2010.

Abusalem H, Harris F, "Comparing Traditional FFT Based Frequency Domain Excision with Poly-Phase Transform Excision", ION 55th Annual Meeting, Cambridge, MA, Jun. 28-30, 1999, pp. 625-634.

Capozza PT, Holland BJ, Hopkinson TM, Landrau RL, A Single Chip Narrow Band Frequency Domain Excisor for a Global Positioning System (GPS) Receiver, IEEE Journal of Solid State Circuits, vol. 35, No. 3, Mar. 2000, pp. 401-411.

Young JA, Lehnert JS, Analysis of DFT Based Frequency Excision Algorithms for Direct Sequence Spread Spectrum Communications, IEEE Transactions on Communications, vol. 46, No. 8, Aug. 2002, pp. 1076-1087.

International Application No. PCT/US2010/046041: International Search Report, Feb. 24, 2011.

International Application No. PCT/US2010/046041: International Preliminary Report on Patentability Chapter II (IPEA/409), Feb. 20, 2012.

International Application No. PCT/US2010/046041: Written Opinion of the International Search Authority, Feb. 20, 2012.

European Patent Application 10 749 951.9: Amended claims filed after receipt of (European) search report, Feb. 22, 2012.

European Patent Application 10 749 951.9: Communication pursuant to Article 94(3) EPC and annex to the communication, May 8, 2013.

* cited by examiner

OPTIMAL NARROWBAND INTERFERENCE REMOVAL FOR SIGNALS SEPARATED IN TIME

CROSS-REFERENCE TO RELATED APPLICATION

This utility application claims the benefit under Title 35 United States Code §119(e) of U.S. Provisional Patent Application No. 61/235,620, which was filed on Aug. 20, 2009, and which is hereby incorporated by reference.

FIELD OF THE INVENTION

The present disclosure relates generally to a method and system for facilitating communications between electronic devices and a master control unit (MCU) when in the presence of a narrowband interferer. A more specific example involves implantable electronic devices, such as a microstimulator capable of RF communication with an external MCU.

BACKGROUND OF THE INVENTION

Although certainly not limited to communication between implanted devices and external control units, the method finds particular application and advantage when used in the implantable arts field. So for example, the field of bionics is a discipline focusing on the application of advanced technologies to biological systems. In other words, bionics relates to physiological processes that are replaced or enhanced by electronic components. Generally speaking, a bionic is a manufactured device or engineered tissue that substitutes for, or augments, the function of a natural limb, organ or other portion of a biological body. Significant strides have been made in the field of bionics and research in bionics offers the greater possibility of restoring function to impaired and damaged biological systems.

An example application of bionic devices includes sensing and stimulating nerves in the body, such as is described in U.S. Pat. No. 6,829,508, entitled "Electrically sensing and stimulating system for placement of a nerve stimulator or sensor", which is hereby incorporated by reference. Additional examples of Bionic devices include restoration or improvement of damage hearing such as is described in U.S. Pat. No. 6,572,531 entitled "Implantable Middle Ear Implant, and U.S. Pat. No. 6,648,813, entitled "Hearing Aid System Including Speaker Implanted In Middle Ear", which are both incorporated herein by reference.

Current developments in the field present a number of opportunities for improving the quality of life with the undertaking of new and exciting research in such areas as drug delivery systems for chronic disabilities, neuromuscular stimulation devices that enable the activation or enhancement of motion to replace lost or impaired motor control, microstimulators to treat chronic disorders of the central nervous system, as well as many others.

An example body implantable device is described in U.S. Pat. No. 6,185,452 entitled "Battery Powered Patient Implantable Device", incorporated herein by reference, which describes body implantable devices for performing stimulation of body tissues, sensing of various body parameters, and communication to other devices external to the patient's body. The implanted devices can utilize a wireless communication means, such as described in U.S. Pat. No. 7,237,712 entitled "Implantable Device and Communication Integrated Circuit Implemented Therein", incorporated herein by reference. The wireless communication of the body implanted device can be facilitated by an antenna such as described in U.S. Pat. No. 6,804,561, entitled "Antenna For Miniature Implanted Medical Device", which is incorporated herein by reference. Throughout the art however, there is almost no discussion relating to signal interference removal for a type of communication signal described as the conventional TDMA signal which has application for certain implantable devices communicating with an external device. It is known that TDMA signals may have widely varying dynamic ranges, for example, as much as 50 db. An attempt was made to solve such problem as described in U.S. Pat. No. 5,741,591, however, there were severe restrictive assumptions placed on both the user wideband signal and the interfering signal to render the teaching relatively ineffectual as a viable solution strategy. Two assumptions for example, were that the interfering signal was a constant continuous wave signal and that the user signal amplitudes did not vary appreciably one from another.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION OF THE PREFERRED EMBODIMENT

Figure 3:
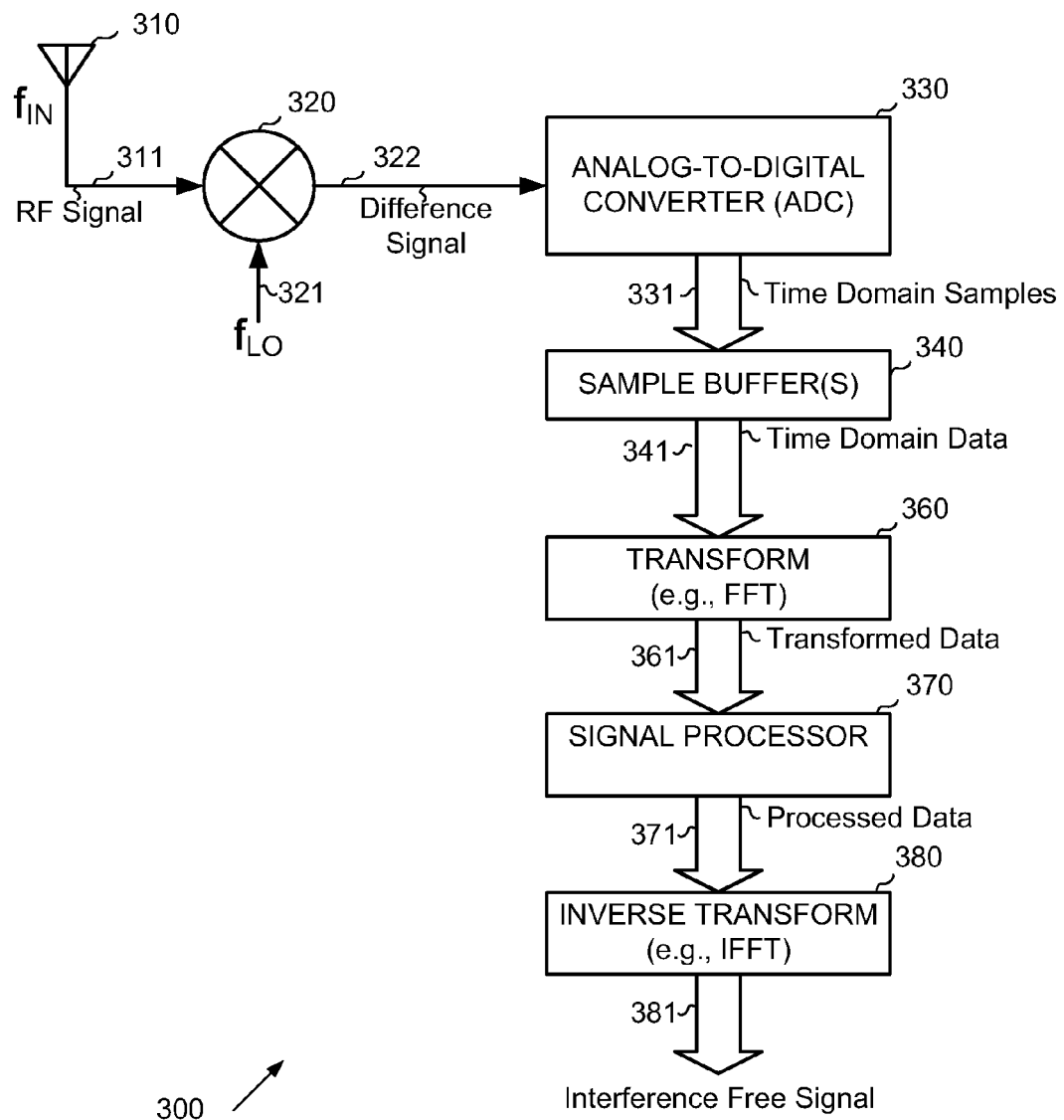
FIG. 3 is a schematic diagram illustrating an example receiver in an MCU.

Various embodiments are described more fully below with reference to the accompanying drawings, which form a part hereof, and which show specific example embodiments for practicing various embodiments. However, other embodiments may be implemented in many different forms and should not be construed as limited to the embodiments set forth herein; rather, these embodiments are provided so that this disclosure will be thorough and complete. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense. Moreover, although the operation of an example receiver in an MCU is shown in FIG. 3, as defined as a series of steps shown in FIG. 5, it is to be understood that reordering selected steps will nevertheless provide identical results in generating an interference free signal.

Briefly stated, the present disclosure relates generally to communication techniques for improving signal reception for a master control unit (MCU) that communicates with an implanted wireless device while in the presence of a narrowband interferer. The implanted wireless device can be any appropriate device such as a microtransponder, microstimulator, a sensor device or a drug delivery device. The MCU captures samples of signals emanating from the wireless device during an expected transmission time interval. The captured samples are transformed from the time domain into a series of spectral terms in the frequency domain that are then evaluated to identify narrowband interference signals. The identified narrowband interference terms can be identified and optimized values for the spectral values corresponding to the interferer are calculated as replacement values for the corrupted spectral values in the transform and an inverse transformation can be used to generate a time domain signal that is free from interference. Other signal processing techniques can also be applied to improve performance.

The described wireless implanted devices can be any appropriate device including, but not limited to transponder devices, microtransponder devices, stimulator devices, microstimulator devices, sensor devices, drug delivery devices, and bionic devices in general. In one example, a Bion device (BION is a registered trademark of Boston Scientific Neuromodulation Corporation for implantable medical devices and systems) can be configured to stimulate or influence a sensory system (e.g., another neural path), a physiological control system (e.g., muscular contraction), or the brain. In such examples, the sensory device is placed internal to the body (e.g., a Bion) and arranged to wirelessly communicate with a master control unit (MCU) that is external to the body. Many varieties of circuits can be arranged to provide such functions where sensory information is relayed, processed, data-logged, or otherwise handled and communicated. However, such communications can be impaired by various noise sources and interference. The presently described systems, apparatuses and methods are arranged to address the noise and interference signals created by a narrowband interferer.

The examples described herein are only to be construed as example applications for body implanted wireless devices. Many embodiments can be made without departing from the spirit and scope of the invention and the invention resides in the claims that follow this disclosure.

Example Operating Environment

Figure 1:
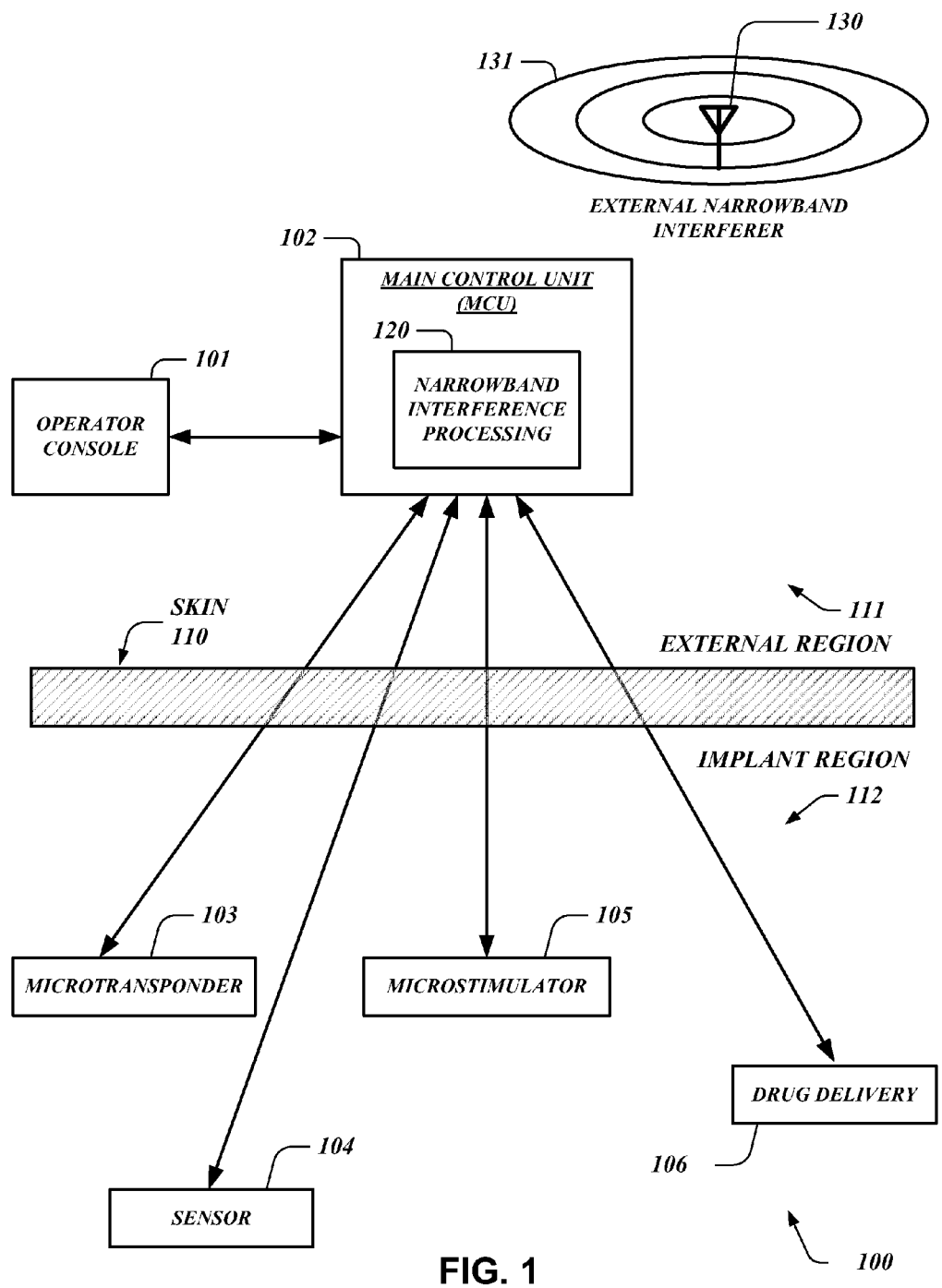
FIG. 1 is a block diagram illustrating an example operating environment for the present disclosure.

FIG. 1 is a block diagram illustrating an example operating environment (100) for the present disclosure. As illustrated in FIG. 1, an example system may include a master control unit or MCU (102) and one or more wireless communication devices (103-106). An operator console (101) can be arranged to communicate, either wirelessly or via a wired transmission, with the MCU (102). The MCU (102) is located in an external region (111) with respect to the body. Any number of wireless communication devices (103-106) can be arranged in communication with the MCU (102) via a wireless communication system that is arranged according to the presently disclosed methods.

Example wireless communication devices include: a microtransponder device (103), a sensory device (104), a stimulator device (105), and a drug delivery device (106). The microtransponder device (103) may be useful as a part of a locator system, where the device may be body implantable device. The sensory device (104) may be useful to collect sensory information such as may be useful for a body implanted neural prosthetic device, or to monitor sensory information for other purposes such as heart rate monitoring, etc. The stimulator device (105) may be useful to stimulate neural pathways in a body implanted application. The drug delivery device (106) is useful in body implanted application where precise drug delivery is desired. Each of the functions of the described wireless communication devices may be combined into a single device, or separated into multiple devices as may be desired for a particular application. The various sensory information and other reporting messages are communicated from the wireless communication device to the MCU (102) such as via a short bust RF communication signal.

An externally located narrowband interferer (130) generates various noise and interference signals (131) that emanate from the point source location as depicted in FIG. 1. Such signals may impair wireless communications between the wireless communication devices (103-106) and the MCU (102). The MCU includes specialized narrowband interference processing means (120) to be discussed in more detail later, to account for the presence of the narrowband interference, and minimize the adverse effects of the narrowband interferer (130) to improve communications.

While many of the above described examples are for medical-type body implantable devices, these examples are merely for illustrative purposes. The present disclosure contemplates all varieties of wireless communication applications including but are not limited to body implanted applications, non-implanted applications, medical applications and non-medical applications.

Figure 2:
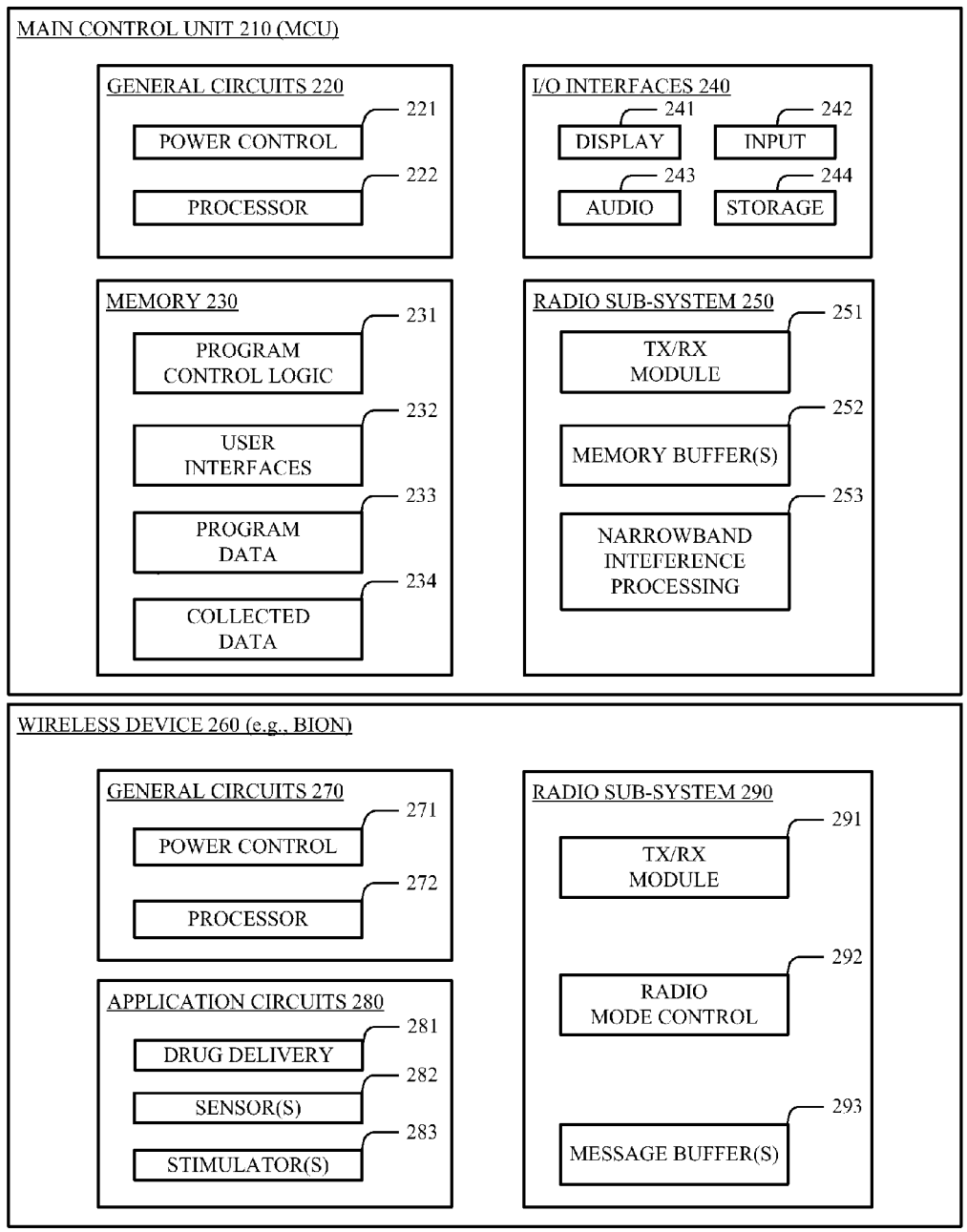
FIG. 2 is a schematic diagram illustrating an example main control unit (MCU) and an example wireless device.

To illustrate an example hardware implementation for the current example device configured to mitigate narrowband interference, FIG. 2 is a schematic diagram (200) illustrating an example MCU (210) and/or an example wireless device (260) such as a Bion. The MCU is illustrated as having four main functional partitions, namely, general circuits (220), a memory (230), I/O interfaces (240), and a radio sub-system (250). The general circuits (220) include power control functions (221) and processor functions (222). The memory (230) may be include both volatile memory and non-volatile memory types as may be required in a particular application, and includes storage for application program control logic (231), user interfaces (232), program data (233), and collected data (234). The I/O interfaces (240) may include analog and/or digital circuits that include functional mechanisms for a display (241), an input (242), an audio (243), and a storage (244). The radio sub-system includes functions for a transmitter/receiver or TX/RX module (251), one or more memory buffers (252), and narrowband interference processing (253). The radio sub-system (250) in the MCU (210) can be arranged to encode and decode radio transmissions to/from the wireless device (260). Although described above in terms of various partitions, one or more of the functional partitions can be combined and/or separated into other physical and/or functional partitions.

The wireless device (260) is illustrated as having three main functional partitions, namely, general circuits (270), application circuits (280), and a radio sub-system (290). The general circuits (260) include power control functions (261) and processor functions (262). Memory (not shown) may be necessary for operation of the processor (272) similar to that previously described. The application circuits (280) may include one or more drug delivery circuits (281), sensor circuits (282), and/or stimulator circuits (283). The radio sub-system (290) includes functions for a transmitter/receiver or TX/RX module (291), a radio mode control (292), and one or more message buffers (293). The radio sub-system (290) in the wireless device (260) can be arranged to encode and decode radio transmissions to/from the MCU (210). Although described above in terms of various partitions, one or more of the functional partitions can be combined and/or separated into other physical and/or functional partitions.

The MCU (210) can be configured to operate in body implanted applications or in non-implanted applications as previously described. The wireless device (260) can transmit control messages via the radio sub-system (240) and process the received messages (e.g., sensory data, etc.) via the processor (232), utilizing programs and user interfaces that are available in the memory (230). In some applications, sensory data is stored in the memory (230) as the collected data (234). In other instances, the MCU (210) is arranged transmit additional control messages to one or more wireless devices (260) to activate various stimulators (e.g., 283) or drug delivery mechanisms (281) in response to the processed sensory data. The power control circuits (231) can be used to monitor and conserve power in body implanted applications of the MCU (210) by powering down various unnecessary circuit functions, and waking various circuit functions either in response to a received message indicating a sensory event, or in response to a predetermined wake-up time interval.

The wireless device (260) can be configured to operate as a Bion such as in body implanted applications or in a non-implanted application such as wearable microtransponder in a locator system. The wireless device (260) can receive control messages from the MCU (210) via the radio sub-system (290) and process the control messages via the processor (272). In response to the control messages, the wireless device (260) can activate any necessary application circuits (280) to collect sensory data via the sensors (282), or deliver drugs via the drug delivery devices (281), or stimulate muscular and/or neural activity with the stimulator devices (283). Sensory data can then be communicated back to the MCU with the radio system (290). The power control circuits (271) can be used to monitor and conserve power in such body implanted applications by powering down various unnecessary circuit functions, and waking various circuit functions either in response to a control message, in response to a sensory event, or in response to a predetermined wake-up time interval.

Examples of processor circuits include both general processing devices and application specific circuits (ASICs). The disclosure, flow charts and algorithms presented herein, provide more than sufficient basis for one skilled in the art to program either a general or specific purpose computer or to configure an ASIC to undertake the claimed method. Examples of general processing devices include microprocessors, microcontrollers, and digital signal processing (DSP) processors. Such processors may be complex instruction set computer (CISC) based processor devices or reduced instruction set computer (RISC) based processors. In some instances the processing functions can be provided by a programmable logic device or PLD such as a generic array logic or gate array logic (GAL) device, a programmable electrically erasable logic (PEEL) device, a complex PLD (CPLD), and a field-programmable gate array logic (FPGA) device, to name a few.

Examples of volatile memory include random access memory (RAM), dynamic random access memory (DRAM), a synchronous dynamic random access memory (SDRAM), a double-data rate SDRAM (DDR SDRAM, DDR2 SDRAM, etc.), to name a few. Examples of non-volatile memory include read only memory (ROM), programmable read only memory (PROM), erasable PROM (EPROM), electrically erasable PROM (EEPROM), static random access memory (SRAM), and flash-type memory, to name a few.

Body implanted wireless devices are typically shielded from external interference as a function of the signal attenuation that is inherently associated with devices implanted in living tissue. As the depth from the skin interface increases, the signal attenuation also increases. It has also been observed that attenuation increases as a function of increasing frequency. In one example, an attenuation of about 20 dB is observed for a 400 MHz signal in a shallow implant (e.g., implanted very near the skin surface).

The attenuation paths between the external and internal systems due to the skin interface have an approximately reciprocal attenuation characteristic. In other words, the attenuation from the MCU to the implanted wireless device is approximately the same as the attenuation from the implanted wireless device to the MCU. Assuming the presence of a non-thermal external interference or noise source, and assuming equal transmit power from both the MCU and the body implanted wireless device, the MCU will perceive a reduced signal-to-noise ratio due to the presence of an interference/noise source. If a fairly narrow-band interferer is present, then the common frequencies used for wireless communications can result in performance degradation. For example, if a 7 dB signal-to-noise-plus-interference ratio is required for a successful wireless communication, then a narrowband interference signal with a received signal strength about 3 dB weaker than the relevant implanted wireless device may prevent or mask a valid communication signal from being successfully received by the MCU. This same interfering signal can be attenuated by at least 20 dB in reaching the implanted wireless device, and thus would be about 23 dB below the received MCU signal, and thus has a negligible effect on the signaling path from the MCU to the implanted wireless device.

The minimum frequency width (bw) that can be observed in a received signal is inversely related to the capture time interval (T=1/bw). In order to conserve power consumption, some wireless devices are not continuously capturing signals via their radio sub-system. Instead, the wireless device will typically be operated in a low power mode until radio reception is required over a radio capture interval. Since the minimum frequency width (bw) is inversely related to the capture time interval, there may not be enough to capture narrow width signals. For example, when a receiver capture time in a wireless device is approximately 6 microseconds (μs), the corresponding minimum observable bandwidth is 160 kHz=⅙ μs. Thus, in some example systems the wireless devices cannot perform a useful narrowband excision operation or interference minimization process. Since the MCU is externally located, the MCU typically does not have the same limited power constraints as the implanted wireless device and can thus be powered up for longer periods of time. A longer receiver capture interval can be used so that narrower frequencies can be separated. For example, when the receiver capture time interval in the MCU corresponds to 100 microseconds (ms), the corresponding minimum observable bandwidth is about 10 kHz=1/100 ms. The communication time differences demonstrates an asymmetrical communication system, where the implanted wireless devices (e.g., transponders) provide short burst communications to the MCU, which uses a much longer signal captures interval to improve frequency resolution.

An implementation to undertake transmissions from an implanted wireless device (e.g., a microstimulator or microtransponder) to an external MCU is illustrated by U.S. Pat. Nos. 6,164,284; 6,564,807; 6,208,894 and 6,315,721, which are all incorporated by reference in their entireties. As described in those references, a frequency range of about 410-415 MHz can be utilized in short transmission bursts. Transmission of signals from the MCU to the implanted device are received by the implanted wireless device, despite transmission losses in air and due to the attenuation effects of body tissue, because the MCU is capable of operation at higher transmission power levels and for longer transmission intervals than the microstimulators. On the other hand, the relatively short transmission interval and the low power transmission capability of the implanted wireless device, which is impacted by about a 20 db loss, that the transmitted signal undergoes traveling through body tissue, limits relative reception of implanted wireless device transmissions by the MCU.

Narrowband noise emanating from external sources in the vicinity of the microstimulator-MCU combination can further interfere with reception of microstimulator signals by the MCU. It is assumed that the interference signals have a frequency of about 412 MHz. [The interference frequencies could be any frequency within the 410-415 MHz range.] Interference signals of much lower or much higher frequencies will have a marginal interference effect on the signal transmitted by the microstimulator and are not of a major concern.

The wireless device transmitters are not mutually phase coherent, due to small frequency errors, and the fact that they can be physically located at varying distances with respect to the MCU. Thus, in general a collection of successive wireless device transmissions will not produce the narrow spectral lines one might see with a single lengthy transmission from a single wireless device. As a consequence of this, a single or several strong spectral lines is generally caused by an external narrowband interferer.

In practice, an example MCU can capture about 100 microseconds of samples, which can correspond to about 1000 complex samples (I/O samples) at a sample rate of 10 MHz. The MCU can later perform a transform from the time domain to another domain where the frequency spectrum of the captured samples can be evaluated to identify narrowband interference signals. In one example, the time domain samples are transformed into a frequency domain representation using a Fast Fourier Transform (FFT). The frequency resolution of the described example operation is about 10 KHz for approximately 1000 complex samples.

The above described observations and limitations will become clear in light of the following example implementations that follow herein.

Example MCU Receiver

FIG. 3 is a schematic diagram illustrating an example receiver in an MCU (300) that is arranged in accordance with at least some aspects of the present disclosure. MCU 300 includes an antenna (310), a mixer (320), an analog-to-digital converter (ADC 330), one or more sample (capture) buffers (memory) (340), a transform block (360) a signal processor (370) and an inverse transform block (380). It should be understood that the signal processor may also include the transform block (360) and the inverse transform block (380).

Referring to FIG. 3, antenna 310 of the MCU (300) receives RF signals (311) that have an input signal frequency corresponding to $f_{IN}$. The RF signals (311) are applied to mixer 320, which also receives a local oscillator signal with a frequency ($f_{LO}$), which down-converts the signal from the RF frequency band to a baseband signal spectrum as a difference signal (322) with a frequency that corresponds to the difference between the input signal frequency ($f_{IN}$) and the local oscillator frequency ($f_{LO}$). The difference signal (322) is coupled from the output of the mixer (320) to an input of the ADC (330). The ADC (330) captures samples of the difference signal (322) and converts the captured samples from an analog signal in the time domain to a digital data signal (Time Domain Samples 331). The output of the ADC (330) is coupled to one or more sample buffers (340), which operate as a memory that stores the time domain samples (331) for later processing. The time domain data (341) is retrieved from the output of the sample buffer (340) and provided to the transform (processor) (360) for further processing.

Transform (360), signal processor (370) and inverse transform (380) can be implemented as a digital signal processor (DSP) or some other equivalent means that can transform the time domain data into another domain for removal of the narrowband interference signal. An example of an equivalent means is an ASIC, which can be configured to carry out required mathematical manipulations and solutions. As illustrated in the example of FIG. 3, the transform block (360) is arranged to transform (e.g., a Fast Fourier Transform or FFT) the time domain data (341) into another domain (e.g., a frequency domain). The transformed data (361) is then processed in signal processor (370) to mitigate the characteristic of the narrowband interference signal and to generate the processed data (371) in the transformed domain. The processed data (371) can then either be inverse transformed (e.g., an Inverse Fast Fourier Transform or IFFT) back into the time domain as Processed Time Domain Data (381) by the inverse transform block (380), or further processing in the transform domain can be performed such as for demodulation of data, commands, or other pertinent information. Although the transform block (360), signal processor block (370), and inverse transform block (380) are illustrated as discrete functional blocks, their functions may be combined and/or partitioned into other functional and/or physical blocks as may be desired in a hardware/software implementation.

In one example, the RF signals (311) are provided in a frequency range of about 410 to 415 MHz, and the mixer (320) is operated with a local oscillator frequency ($f_{LO}$) of about 408 MHz. For this example, the difference signal (322) has a frequency in a range of about 2-7 MHz, and thus an effective bandwidth of about 5 MHz. The sample buffers in this example can store at least 24,000 complex samples from the output of ADC (330) conversion.

Once the captured samples are presented in the transformed domain to provide a matrix (representation) of spectral terms, large amplitude spectral peaks can be identified as being derived from interferer signals and which have otherwise corrupted corresponding spectral terms. Once the corrupted spectral terms are identified and rather than notching the spectral terms to "zero" or calculating an average value thereof, the signal processor (370) can determine what the corrupted spectral terms should be (replacement value) if there were no interferer present. The signal processor (370) replaces the corrupted spectral values with the calculated replacement spectral values and an inverse transform (e.g., an inverse FFT, IFFT) can then be used to transform the signals from the transformed domain back into the time domain representation for further processing.

An optional demodulation process can be applied to the time domain signals after the inverse transformation process is completed. The demodulation process can be executed as a digital demodulation that operates on a stream of digital data, or as an analog demodulation process that operates on continuous time domain signals. The demodulated signals can then be processed by the MCU for any desired operation such as extraction of command instructions, extraction of data from sensors, or any other reasonable purpose.

In some alternative implementations, the demodulation process can be performed in the transformed domain without first performing an inverse transformation back to the time domain. In such a fashion a spectrum associated with the signals in the transformed domain may correspond to demodulated information such as commands, data, or other pertinent information that is processed by the MCU. A simple look-up-table (LUT) can identify signatures (e.g., an expected frequency spectrum) in the transform domain for demodulated signals. A correlation between the observed spectrum in the transform domain and the LUT signatures can be performed to identify the appropriate demodulated signals.

Note that a single microstimulator transmitter operated for the customary 6 microsecond interval generates a spectrum whose frequency resolution is limited in resolution by the same 6 microseconds. The MCU with its longer capture and processing period can separate out narrow band signals without removing an entire 160 KHz wide spectral chunk, which action could greatly degrade the received data.

Example Frequency Domain Analysis in the MCU Receiver

Figure 4:
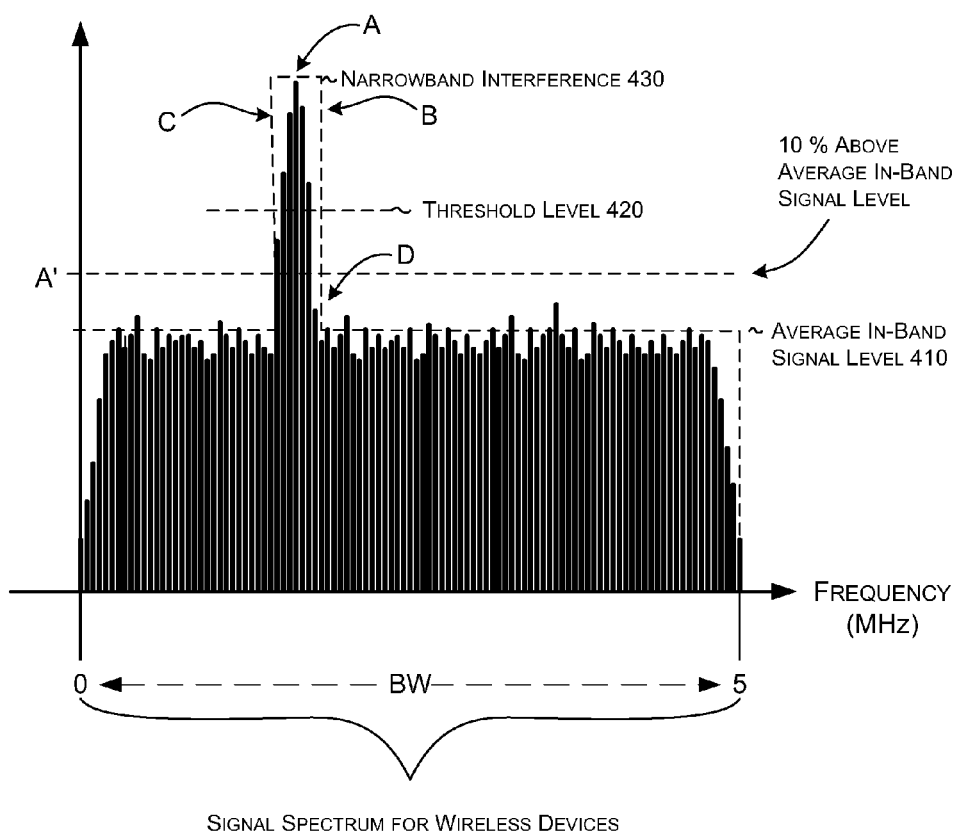
FIG. 4 is a graphical diagram illustrating an example frequency spectrum for signals received from a wireless device by an MCU that is in the presence of a narrowband interferer.

FIG. 4 is a graphical diagram illustrating an example frequency spectrum (400) for signals received from a wireless device by an MCU that is in the presence of a narrowband interferer, in accordance with aspects of the present disclosure.

As illustrated in FIG. 4, signal amplitudes for a 5 MHz bandwidth (BW) is illustrated with a baseband frequency spectrum ranging from about 0-5 MHz, which is a reasonable expected signal spectrum for the down-converted transmissions from various wireless devices (e.g., microstimulators) to an MCU. The BW may be arranged to be either narrower or wider to accommodate design and operational considerations. The illustrated signal spikes represent a frequency domain transform (e.g. an FFT) that is applied to the time domain data from an example captured signal. As an example, a peak level for a narrowband interference signal is illustrated occurring at a frequency of approximately 1.6 MHz. The peak level exceeds the average signal level for the other in-band signals as is depicted in the drawing.

A threshold level for identifying the narrowband interference can also be selected as illustrated by the cut threshold level. Whenever narrowband interference is detected above the cut threshold level, the signal amplitude levels for the spectral terms identified as narrowband interference can be identified for further processing. The cut threshold level can be selected based on any reasonable criteria such as, for example, a desired percentage or decibel level above the average in-band signal level, a specific signal amplitude level not based on the average in-band signal level, or any other appropriate criteria.

In one example implementation, a series of FFT bins can be used to represent each of the particular frequency spikes shown in the figure (e.g., $BIN_1$-$BIN_N$ for N discrete frequency bins). The frequency bins can thus divide the signal spectrum into equally spaced frequency ranges (e.g., each bin represents a range of frequencies with a width of 5 kHz, or some other desired frequency range such as 10 KHz, 15 kHz, etc.).

The process of optimizing the corrupted spectral terms can be undertaken at the signal processor (370). In this process, the value of the contents of each bin is compared to the average value of the contents of all of the bins. In one mere example, if the interference signal is greater than about 10% as shown by level indicated as A', then the value of interference signal A in terms of its spectral value, will be optimized. Similarly, interference signals B and C can also be optimized in terms of their spectral value since their signal level is greater than 10% of the average in band signal level. However, interference signal D is shown to be less than 10% greater than the average in band signal level, indicating that no optimization should be taken for D. The effect of taking no optimization with regard to interference signal D is considered acceptable providing little "contamination" of the true data signal. The 10% threshold value for optimization is merely one illustrative example, and larger levels such as 10 or 20 db above the average level could be used, depending on the application. Other "peak detection" strategies may also be used without departing from the spirit of the invention.

Processing of any of the spectral terms determined to be corrupted, can be optimized by determining the value of the corresponding spectral term if no interference was present.

In terms of an example FFT process, 1023 or 4095 bins can be provided over a frequency band of 5 MHz, with a bin width of about 4.88 KHZ or 1.22 KHz respectively, which is relatively small in order to detect an interference signal with a 3 KHz bandwidth. In a design where there are 4095 bins, with each bin having a 3 KHz bandwidth, then the input signal to the FFT has to have a bandwidth of 12.285 MHz. For an FFT process providing 1023 bins, the bin width is about 4.88 KHZ which is more appropriate for detecting an interference signal having a BW of 3 KHZ.

Subsequent to the process undertaken in signal processor 370, an inverse FFT can be taken at block 380 to extract the transmitted data signal received by the MCU from the wireless device (e.g., the a microstimulator or microtransponder essentially free of interference signals. The output of the IFFT is provided to demodulator 390. However, as described previously, in some implementations it may be desirable to perform the demodulation operation in the transformed domain. For example, a microstimulator signal may have a frequency signature that includes one or more tones (i.e., individual frequencies) that can be referred to in a look-up table to translate directly into demodulated data signals.

Example Process Flow for MCU Receiver Operation

Figure 5:
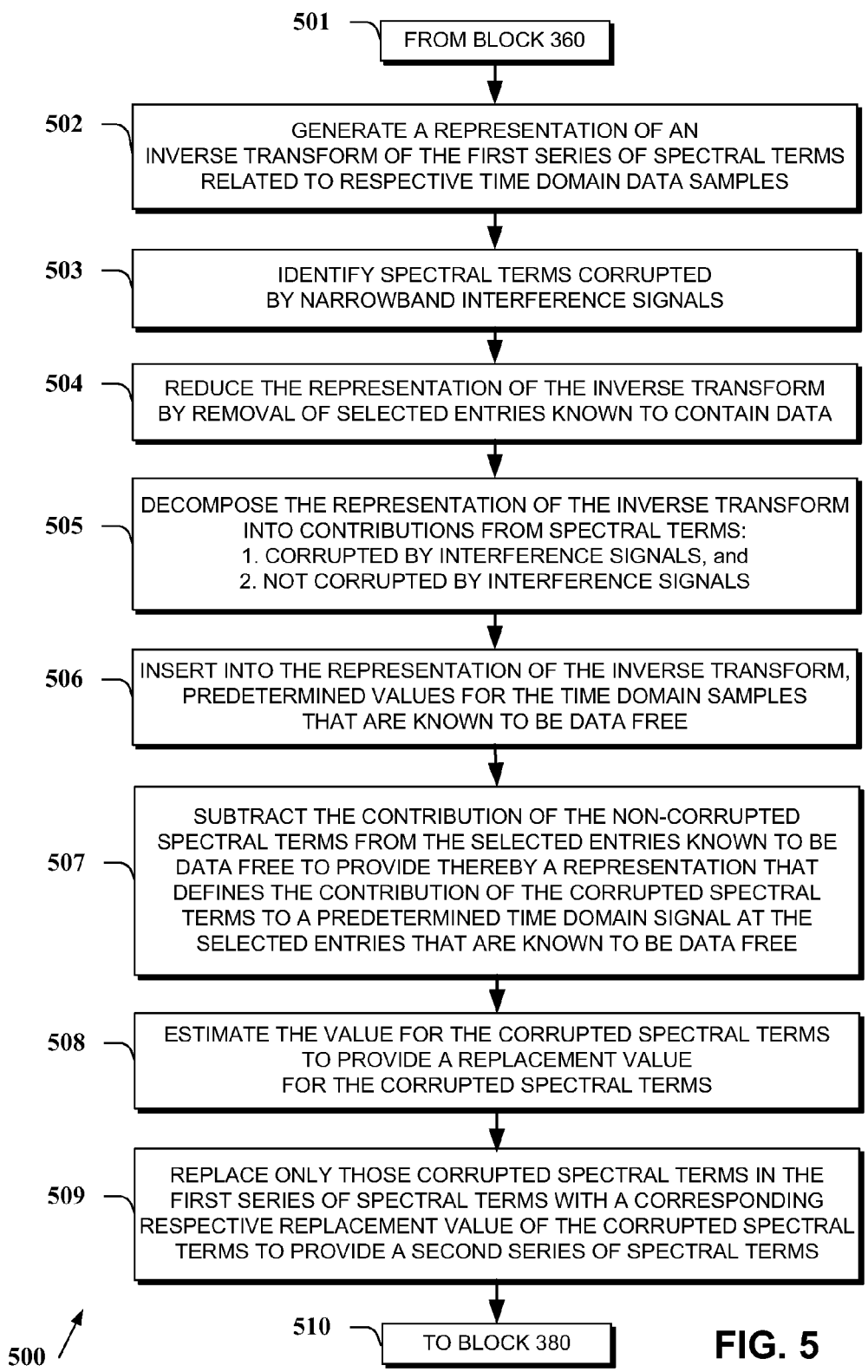
FIG. 5 is a flow chart illustrating the operation of an example receiver in an MCU.

FIG. 3 is a schematic diagram illustrating an example receiver in an MCU and FIG. 5 is a flow chart (500) illustrating the operation of an example signal processor 370 in a receiver, arranged in accordance with at least some aspects of the present disclosure.

At block 320, the receiver is arranged to mix down the received RF signal (e.g., with a local oscillator of frequency $f_{LO}$) to generate a difference signal in the baseband frequency range. At block 330, the difference signal is sampled to generate time domain samples (e.g., via ADC 330).

At block 340, the time domain samples are stored in memory (e.g., sample buffers 340) as time domain data, which can optionally include overlapped windows of data as may be required for accurate transform processing.

At block 360, a transform, e.g. an FFT, or a DFT, is applied to the time domain data to generate transformed data, i.e., a first series of spectral terms, which is in the frequency domain. From block 360, flow proceeds to signal processor 370, via block 501 in FIG. 5.

In block 502, the transformed data is used to generate a representation of an IFFT of the first series of spectral terms related to respective time domain data samples. An IFFT is computed as:

$$x(n) = \frac{1}{N} \sum_{k=0}^{N-1} X(k) e^{j2\pi nk/N} \quad (1)$$

where x(0) to x(N−1) are complex numbers.

To ease readability, the exponential terms are replaced with the following twiddle factor term (ignoring the 1/N term for now)

$$x(n) = \frac{1}{N}\sum_{k=0}^{N-1} X(k)e^{j2\pi nk/N} = \sum_{k=0}^{N-1} X(k)w_{n,k} \quad (2)$$

This computation can be written in matrix form as:

$$W \times v = m \quad (3)$$

$$\begin{bmatrix} w_{0,0} & w_{0,1} & \cdots & w_{0,N-1} \\ w_{1,0} & w_{1,1} & \cdots & w_{1,N-1} \\ \vdots & & \ddots & \vdots \\ w_{N-1,0} & \cdots & & w_{N-1,N-1} \end{bmatrix} \begin{bmatrix} v(0) \\ v(1) \\ \vdots \\ v(N-1) \end{bmatrix} = \begin{bmatrix} m(0) \\ m(1) \\ \vdots \\ m(N-1) \end{bmatrix} \quad (4)$$

where W is a matrix of IFFT twiddle factors (also known as a convolution matrix), v is a matrix of FFT bins generated in block 360 and m is a vector representing the time domain samples to be obtained from the IFFT. Twiddle factors as is known and understood in the art are the root of unity complex multiplicative constants used in FFT algorithms.

At block 503, the transformed data is evaluated and any narrowband interference(s) are identified such as previously described (e.g., by evaluating signal levels in the transformed domain, "peak detection", average values, threshold levels etc.).

Continuing to block 504, the representation of the IFFT is reduced by removal of selected entries known to contain data. Given t time samples known not to contain data, whose temporal locations are hereby labeled as:

$$z_1, z_2, \ldots, z_t \text{ where } t < N. \quad (5)$$

Rows are removed from the above matrix equation (4) that correspond to time instants at which data exists, leaving a reduced system of equations representing a partial IFFT that solves for only those time instants $(z_1, z_2, \ldots, z_t)$ where no data exists. The resulting representation can be written as:

$$C \times v = m'b \quad (6)$$

where b is a vector=m' $(z_1, z_2, \ldots, z_t)$.
Equation (6) written in matrix form is shown below as equation (7).

$$\begin{bmatrix} w_{z_1,0} & w_{z_1,1} & \cdots & w_{z_1,N-1} \\ w_{z_2,0} & w_{z_2,1} & \cdots & w_{z_2,N-1} \\ \vdots & & \ddots & \vdots \\ w_{z_t,0} & \cdots & & w_{z_t,N-1} \end{bmatrix} \begin{bmatrix} v(0) \\ v(1) \\ \vdots \\ v(N-1) \end{bmatrix} = \begin{bmatrix} m(z_1) \\ m(z_2) \\ \vdots \\ m(z_t) \end{bmatrix} = \begin{bmatrix} b(1) \\ b(2) \\ \vdots \\ b(t) \end{bmatrix} \quad (7)$$

Continuing on to block 505, equation (7) can be decomposed into two separate representations (matrices), one matrix multiplied by a vector of corrupted bins and another matrix multiplied by a vector of uncorrupted bins. For an instance where "q" bins are corrupted at frequency locations:

$$g_1, g_2, \ldots, g_q, q < N \quad (8)$$

then the decomposed representations can take on the form:

$$H \times f + D \times p = b \quad (9)$$

or in alternate matrix format:

$$H \times f + \begin{bmatrix} w_{z_1,g_1} & w_{z_1,g_2} & \cdots & w_{z_1,g_q} \\ w_{z_2,g_1} & w_{z_2,g_2} & \cdots & w_{z_2,g_q} \\ \vdots & & \ddots & \vdots \\ w_{z_t,g_1} & \cdots & & w_{z_t,g_q} \end{bmatrix} \begin{bmatrix} v(g_1) \\ v(g_2) \\ \vdots \\ v(g_q) \end{bmatrix} = \begin{bmatrix} m(z_1) \\ m(z_2) \\ \vdots \\ m(z_t) \end{bmatrix} \quad (10)$$

An analysis of the H×f portion of equation (10) reveals that the matrix vector product H×f is the IFFT of the signal (at the "t" time instants) with "zeros" placed into the "q" corrupted bins during the IFFT matrix computation.

The vector b with no interference signals present, then equals:

$$\begin{bmatrix} m(z_1) \\ m(z_2) \\ \vdots \\ m(z_t) \end{bmatrix} = 0 \quad (11)$$

At block 506, predetermined values (e.g. zeros) for the time domain samples that are known to be data free are inserted into the b vector of the representation of the IFFT. Inserting "zeros" for the samples known to be data free, is consistent, for example, with a communications signals in a TDMA data stream. A TDMA frame includes a data portion and leading and trailing guard bands which are deliberately structured to be data free portions, which then provides for insertion of the corresponding "zeros" in the b vector, as previously described. It should be noted that although "zeros" are the preferable predetermined values which effectively results in the elimination of the vector b, any predetermined constant value may be used as well with however, the attendant extra computational requirements.

With the b vector set to "zero", equation (9) can be rewritten as:

$$D \times p = -H \times f \quad (12)$$

which is equivalent to transferring H×f to the right side of equation (9) which is also equivalent to the step undertaken in block 507 of subtracting the contribution of the non-corrupted spectral terms from the selected entries known to be data free to provide thereby a representation that defines the contribution of the corrupted spectral terms to a predetermined time domain signal at the selected entries that are known to be data free.

Equation (12) can be written in matrix format as:

$$\begin{bmatrix} w_{z_1,g_1} & w_{z_1,g_2} & \cdots & w_{z_1,g_q} \\ w_{z_2,g_1} & w_{z_2,g_2} & \cdots & w_{z_2,g_q} \\ \vdots & & \ddots & \vdots \\ w_{z_t,g_1} & \cdots & & w_{z_t,g_q} \end{bmatrix} \begin{bmatrix} v(g_1) \\ v(g_2) \\ \vdots \\ v(g_q) \end{bmatrix} = -H \times f \quad (13)$$

In block 508, equation (13) may be solved using any one of a number of solution methods with for example, a least squares fitting technique and preferably a least means squares (LMS) technique to provide an estimate of the value for the corrupted spectral values to provide a replacement value for the corrupted spectral terms. Since H×f is a known quantity it may be computed and equation (13) may be computed by minimizing:

$$\min \|(D \times p) - (-H \times f)^2\| \quad (14)$$

p
whose solution is well known as:

$$p = (D^H \times D)^{-1} \times D^H (-H \times f) \quad (15)$$

where $D^H$ denotes the Hermetian transpose of matrix D.

Thus by computing the vector p by solving the normal equations, estimates for the corrupted bin values (magnitude and phase) are calculated. Importantly, if the number of "zero" time instants is larger than the number of corrupted bins (extra known "zero" time instants may be inserted to assure that this will be the case), then equation (12) is simply an over determined matrix representation that is solvable using well known least squares techniques. A LMS computation will optimize the corrupted bins producing an FFT for those bins which will produce the nearest possible fit to having "zeros" in the time instants that are expected to be "zero".

Methods for calculating least squares fit include several iterative and non-iterative methods. For example, iterative methods include Cholesky decomposition, Gauss-Seidel and Jacobi. A preferable method is called Conjugate Gredients because it provides a solution technique requiring the least amount of computation and the least amount of iterations to a reasonable error tolerance.

Continuing to block 509, the just calculated replacement values are used to replace only those corrupted spectral terms in the first series of spectral terms with a corresponding respective replacement value for the corrupted spectral terms to provide a second series of spectral terms.

Finally at block 510, the resulting representation (second series of spectral terms) now containing the replacement values for the corrupted spectral terms is provided to block 380 where an inverse transform is undertaken generating thereby an interference free signal.

The above described process can also be applied over multiple capture intervals to form an extended capture interval. In an extended capture interval, a common narrowband interferer can be identified by processing messages from multiple wireless devices. For example, in one communication methodology a time-division multiplexing scheme can be employed so that each wireless device that is arranged to communicate with a common MCU can be assigned to a time slot. Each time slot may correspond to a receiver capture interval associated with one particular wireless device. However a multiplicity of the wireless devices may communicate with the same MCU over the extended capture interval so that all of the devices that are expected to communicate with the same MCU. After all of the messages are communicated to the common MCU, the MCU can collectively identify a common narrowband interferer using the above described methods (e.g., average value of spectral term, peak detection, highest value, values above a threshold, etc.).

Ideally, multiple capture intervals are applied to a series of spectral terms with overlapping time domain windows related to the time domain data. By utilizing overlapping windows in multiple capture intervals, a clear spectral term will accumulate above others for a narrowband interferer that is common to the various capture intervals, and/or for multiple wireless devices that transmit their communication messages over an extended capture interval.

In one example, the receiver capture interval for the MCU is longer than the transmit capture interval for a wireless device such as an order of two-to-one, three-to-one, four-to-one, five-to-one, etc. The overlapping windows over the extended capture interval will increase the accuracy of identifying a narrowband interferer. In other examples the receiver capture interval for the MCU is longer than the transmit capture interval for all wireless devices that are communicating with a common MCU. In a simple example, the receiver capture interval will be more than two transmit time intervals, one for each of two wireless devices. However, multiple wireless devices can also communicate multiple times each, extending the receiver capture interval for overlapping time windows further. Also, numerous wireless devices may be utilized in some instances such that a single capture interval for each of the wireless devices collectively results in a receiver interval for the MCU that extends to one-hundred or more transmit intervals for the wireless devices.

Although the electronic systems, circuits, and methods are illustrated by various individual blocks, the scope of the present disclosure should not be interpreted as limited to these discrete blocks. One or more of the blocks may be combined or separated into other blocks that provide a similar functionality. The invention is not limited to the precise configurations and embodiments described above. Various modifications, alternatives, changes, and equivalents will be apparent to those skilled in the art and are considered within the spirit and scope of the present disclosure. Since many embodiments of the invention can be made without departing from the spirit and scope of the invention, the invention resides in the claims hereinafter appended.

What is claimed is:

1. A method of removing narrowband interference signals from communication signals having both data and data free intervals comprising the steps of:

sampling the communication signals to generate time domain data samples thereof;

transforming the time domain samples into a first series of spectral terms in the frequency domain, said samples containing data and data free intervals;

generating a representation of an inverse transform of the first series of spectral terms related to respective time domain data samples;

identifying spectral terms corrupted by said narrowband interference signals;

reducing the representation of the inverse transform by removal of data containing entries of the representation, which are entries for time domain samples known to contain data;

decomposing the representation of the inverse transform into contributions from spectral terms corrupted by said narrowband interference signals and into contributions from spectral terms not corrupted by narrowband interference signals;

inserting, into non-corrupted entries of the decomposed representation, which are the entries for spectral terms not corrupted by narrowband interference signals, predetermined values for the time domain samples that are known to be data free;

subtracting the contribution of the non-corrupted spectral terms from the data free entries of the representation, which are entries for time domain samples known to be data free, to provide thereby a representation that defines the contribution of the corrupted spectral terms to a predetermined time domain signal at the data free entries;

estimating the value for the corrupted spectral terms that contribute to the predetermined time domain signal at the data free entries to provide a replacement value for the corrupted spectral terms;

replacing only those corrupted spectral terms in the first series of spectral terms with a corresponding respective replacement value of the corrupted spectral terms to provide thereby a second series of spectral terms; and inverse transforming the second series of spectral terms to provide an essentially interference free signal.

2. The method of claim 1, wherein the step of estimating further comprises the step of utilizing a least means square fitting technique to calculate the value for the corrupted spectral terms to provide a replacement value for the corrupted spectral terms.

3. The method of claim 1, wherein the step of transforming to the frequency domain comprises the step of performing a Fast Fourier Transform on the time domain data samples.

4. The method of claim 1, wherein the step of inverse transforming the second series of spectral terms comprises the step of performing an inverse Fast Fourier Transform on the second series of spectral terms.

5. A method of removing narrowband interference signals from RF signal transmissions having both data and data free intervals comprising the steps of:
receiving the RF signals;
mixing the RF signals with a local oscillator to generate a frequency limited baseband signal;
sampling the baseband signal to generate time domain data samples;
storing the samples in a capture memory as time domain data samples;
transforming to the frequency domain the time domain data samples from the capture memory into a first series of spectral terms;
generating a representation of an inverse transform of the first series of spectral terms related to respective time domain data samples;
identifying spectral terms corrupted by said narrowband interference signals;
reducing the representation of the inverse transform by removal of selected data containing entries of the representation, which are entries for time domain samples known to contain data;
decomposing the representation of the inverse transform into contributions from spectral terms corrupted by said narrowband interference signals and into contributions from spectral terms not corrupted by narrowband interference signals;
inserting, into non-corrupted entries of the decomposed representation, which are the entries for spectral terms not corrupted by narrowband interference signals, predetermined values for the time domain samples that are known to be data free;
subtracting the contribution of the non-corrupted spectral terms from selected data free entries of the representation, which are entries for time domain samples known to be data free, to provide thereby a representation that defines the contribution of the corrupted spectral terms to a predetermined time domain signal at the selected data free entries;
estimating the value for the corrupted spectral terms that contribute to the predetermined time domain signal at the selected data free entries to provide a replacement value for the corrupted spectral terms;
replacing only those corrupted spectral terms in the first series of spectral terms with a corresponding respective replacement value of the corrupted spectral terms to provide thereby a second series of spectral terms; and
inverse transforming the second series of spectral terms to provide an essentially interference free signal.

6. A system for removing narrowband interference signals from communication signals having both data and data free intervals comprising: a receiver that is arranged to sample the communication signals and to generate time domain samples thereof; a capture memory that is arranged to store the time domain samples associated with the communication signals; and a signal processor that is arranged to process the stored time domain samples, wherein the signal processor is arranged to: transform into a first series of spectral terms in the frequency domain, the stored time domain samples, said samples containing data and data free intervals; evaluate the series of spectral terms in the transformed domain to identify one or more corrupted spectral terms associated with the narrowband interference signals from the narrowband interference source, wherein the identified corrupted spectral terms are unrelated to the communication signals; generate a representation of an inverse transform of the first series of spectral terms related to respective time domain samples; reduce the representation of an inverse transform by removal of selected entries known to contain data; decompose the representation of the inverse transform into contributions from spectral terms corrupted by said narrowband interference signals and into contributions from spectral terms not corrupted by narrowband interference signals; insert, into non-corrupted entries of the decomposed representation, which are the entries for spectral terms not corrupted by narrowband interference signals, predetermined values for the time domain samples that are known to be data free; subtract the contribution of the non-corrupted spectral terms from selected data free entries of the representation, which are entries for time domain samples known to be data free, to provide thereby a representation that defines the contribution of the corrupted spectral terms to a predetermined time domain signal at the selected data free entries; estimate the value for the corrupted spectral terms associated with the narrowband interference source as a replacement value for said spectral terms; replace those corrupted spectral terms with a corresponding respective replacement value to generate a second series of spectral terms which represents a series of spectral terms having the interference signal removed without removing the content of the communication signals, the second series of spectral terms being determined in consideration of the contribution of the corrupted spectral terms to a predetermined time domain signal at selected spectral terms related to the data free intervals; and inverse transform the second series of spectral terms to provide an interference free signal.

7. The system of claim 6 wherein the predetermined values are a mathematical zero or a mathematical constant, other than zero.

8. The system of claim 6, wherein the signal processor is further arranged to store each spectral term in a respective bin from an array of bins after the transformation from the time domain into the transformed domain, wherein each bin from the array of bins represents a portion of a predetermined baseband frequency bandwidth.

9. The system of claim 6, wherein the signal processor is further arranged such that stored samples that are grouped together within a time domain interval are transformed together into the series of spectral terms.

10. The system of claim 6, wherein the signal processor is further arranged to evaluate the series of spectral terms by comparing the accumulated values in each bin to a threshold value.

* * * * *